United States Patent
Konoma

(10) Patent No.: US 11,239,820 B2
(45) Date of Patent: Feb. 1, 2022

(54) ACOUSTIC WAVE DEVICE

(71) Applicant: Murata Manufacturing Co., Ltd., Nagaokakyo (JP)

(72) Inventor: Chihiro Konoma, Nagaokakyo (JP)

(73) Assignee: MURATA MANUFACTURING CO., LTD., Kyoto (JP)

(*) Notice: Subject to any disclaimer, the term of this patent is extended or adjusted under 35 U.S.C. 154(b) by 589 days.

(21) Appl. No.: 16/176,037

(22) Filed: Oct. 31, 2018

(65) Prior Publication Data
US 2019/0068160 A1 Feb. 28, 2019

Related U.S. Application Data

(63) Continuation of application No. PCT/JP2017/015375, filed on Apr. 14, 2017.

(30) Foreign Application Priority Data

Jun. 7, 2016 (JP) .............................. JP2016-113332

(51) Int. Cl.
*H03H 9/02* (2006.01)
*H01L 41/047* (2006.01)
(Continued)

(52) U.S. Cl.
CPC ..... *H03H 9/02929* (2013.01); *H01L 41/0477* (2013.01); *H01L 41/29* (2013.01);
(Continued)

(58) Field of Classification Search
CPC ........... H03H 9/02929; H03H 9/02992; H03H 9/14541; H01L 41/0471
(Continued)

(56) References Cited

U.S. PATENT DOCUMENTS

2004/0070313 A1* 4/2004 Furukawa .......... H03H 9/14541
310/313 R
2009/0121584 A1 5/2009 Nishimura et al.
(Continued)

FOREIGN PATENT DOCUMENTS

JP 2005-197595 A 7/2005
JP 2007-282294 A 10/2007
(Continued)

OTHER PUBLICATIONS

Official Communication issued in International Patent Application No. PCT/JP2017/015375, dated Jul. 4, 2017.
(Continued)

*Primary Examiner* — Derek J Rosenau
(74) *Attorney, Agent, or Firm* — Keating & Bennett, LLP

(57) ABSTRACT

An acoustic wave device includes a piezoelectric substrate and an IDT electrode directly or indirectly disposed on the piezoelectric substrate. The IDT electrode includes first metal layers, a second metal layer disposed on one of the first metal layers, and a third metal layer disposed on the second metal layer. The first, second, and third metal layers include side surfaces, respectively. The side surface includes a first end portion adjacent to the second metal layer. The side surface includes a second end portion adjacent to the second metal layer. In at least a portion of the IDT electrode, a creepage distance stretching from the first end portion to the second end portion via the side surface of the second metal layer is longer than a distance between the first end portion and the second end portion.

19 Claims, 8 Drawing Sheets

(51) Int. Cl.
*H01L 41/29* (2013.01)
*H03H 9/145* (2006.01)
*H03H 9/25* (2006.01)
*H03H 3/08* (2006.01)

(52) U.S. Cl.
CPC .... *H03H 9/02992* (2013.01); *H03H 9/14541* (2013.01); *H03H 9/25* (2013.01); *H03H 3/08* (2013.01)

(58) Field of Classification Search
USPC ...... 310/313 R, 313 A, 313 B, 313 C, 313 D
See application file for complete search history.

(56) References Cited

U.S. PATENT DOCUMENTS

| | | | |
|---|---|---|---|
| 2011/0156531 A1 | 6/2011 | Tamazaki et al. | |
| 2012/0161577 A1 | 6/2012 | Abbott et al. | |
| 2013/0207514 A1* | 8/2013 | Sakaguchi | H03H 9/02818 310/313 B |
| 2013/0249647 A1 | 9/2013 | Nakanishi et al. | |
| 2016/0056789 A1 | 2/2016 | Otsubo et al. | |

FOREIGN PATENT DOCUMENTS

| | | |
|---|---|---|
| JP | 2011-135469 A | 7/2011 |
| JP | 2012-186808 A | 9/2012 |
| JP | 5131117 B2 | 1/2013 |
| JP | 2013-544041 A | 12/2013 |
| WO | 2012/169452 A1 | 12/2012 |
| WO | 2014/185331 A1 | 11/2014 |

OTHER PUBLICATIONS

Official Communication issued in corresponding Korean Patent Application No. 10-2018-7031239, dated Sep. 26, 2019.

* cited by examiner

ACOUSTIC WAVE DEVICE

CROSS REFERENCE TO RELATED APPLICATIONS

This application claims the benefit of priority to Japanese Patent Application No. 2016-113332 filed on Jun. 7, 2016 and is a Continuation Application of PCT Application No. PCT/JP2017/015375 filed on Apr. 14, 2017. The entire contents of each application are hereby incorporated herein by reference.

BACKGROUND OF THE INVENTION

1. Field of the Invention

The present invention relates to an acoustic wave device.

2. Description of the Related Art

Acoustic wave devices have been widely used as filters for cellular phones and the like. For example, Japanese Patent No. 5131117 discloses an acoustic wave device that includes an IDT electrode defined by a multilayer metal film. The IDT electrode is a multilayer metal film that includes a NiCr layer, a Pt layer, a Ti layer, and an AlCu layer disposed in this order from a piezoelectric substrate side.

In the acoustic wave device disclosed in Japanese Patent No. 5131117, the Pt layer and the AlCu layer of the IDT electrode are provided with the Ti layer interposed therebetween, which serves as a barrier layer. However, Al atoms in the AlCu layer may move, due to surface diffusion, along the side surface of the Ti layer and reach the Pt layer. Such electrochemical migration may cause Al and Pt to be alloyed in the Pt layer. This tends to deteriorate the characteristics of the acoustic wave device.

SUMMARY OF THE INVENTION

Preferred embodiments of the present invention provide acoustic wave devices that reduce or prevent electrochemical migration in an IDT electrode.

In a broad aspect of an acoustic wave device according to a preferred embodiment of the present invention, the acoustic wave device includes a piezoelectric body and an IDT electrode directly or indirectly disposed on the piezoelectric body. The IDT electrode includes a first metal layer, a second metal layer disposed on the first metal layer, and a third metal layer disposed on the second metal layer. The first metal layer includes a side surface that connects a surface of the first metal layer adjacent to the piezoelectric body to a surface of the first metal layer adjacent to the second metal layer; and the side surface of the first metal layer includes a first end portion, the first end portion being an end portion adjacent to the second metal layer. The second metal layer includes a side surface that connects a surface of the second metal layer adjacent to the first metal layer to a surface of the second metal layer adjacent to the third metal layer. The third metal layer includes a side surface that connects a surface of the third metal layer adjacent to the second metal layer to a surface of the third metal layer opposite the second metal layer; and the side surface of the third metal layer includes a second end portion, the second end portion being an end portion adjacent to the second metal layer. In at least a portion of the IDT electrode, a creepage distance stretching from the first end portion to the second end portion via the side surface of the second metal layer is longer than a distance between the first end portion and the second end portion.

In a specific aspect of an acoustic wave device according to a preferred embodiment of the present invention, throughout an outer periphery of the third metal layer in plan view, the creepage distance stretching from the first end portion to the second end portion via the side surface of the second metal layer is longer than the distance between the first end portion and the second end portion.

In another specific aspect of an acoustic wave device according to a preferred embodiment of the present invention, the side surface of the second metal layer is located outside the second end portion in plan view, and the surface of the second metal layer adjacent to the first metal layer includes a noncontact portion not in contact with the first metal layer.

In another specific aspect of an acoustic wave device according to a preferred embodiment of the present invention, a direction in which the noncontact portion extends intersects a direction in which a principal surface of the piezoelectric body extends.

In another specific aspect of an acoustic wave device according to a preferred embodiment of the present invention, the noncontact portion extends farther from the piezoelectric body with decreasing distance to the side surface of the second metal layer.

In another specific aspect of an acoustic wave device according to a preferred embodiment of the present invention, the second metal layer includes a first barrier layer disposed on the first metal layer and a second barrier layer disposed on the first barrier layer.

In another specific aspect of an acoustic wave device according to a preferred embodiment of the present invention, the second barrier layer includes a side surface that connects a surface of the second barrier layer adjacent to the first barrier layer to a surface of the second barrier layer adjacent to the third metal layer; and at least a portion of an end portion of the side surface of the second barrier layer, the end portion being adjacent to the first barrier layer, is located closer to the third metal layer than a portion of the second barrier layer in contact with the first barrier layer.

In another specific aspect of an acoustic wave device according to a preferred embodiment of the present invention, the acoustic wave device further includes a metal oxide layer interposed between the first barrier layer and the second barrier layer.

In another specific aspect of an acoustic wave device according to a preferred embodiment of the present invention, the IDT electrode includes first and second busbars arranged opposite to each other, a plurality of first electrode fingers each connected at one end thereof to the first busbar, and a plurality of second electrode fingers interdigitated with the plurality of first electrode fingers and each connected at one end thereof to the second busbar; in the IDT electrode, a region where the first and second electrode fingers overlap as viewed in an elastic wave propagation direction is an overlap region; the overlap region includes a central area where an acoustic velocity of elastic waves is relatively high, and low-acoustic-velocity portions where the acoustic velocity is lower than in the central area, the low-acoustic-velocity portions being disposed at both ends of the central area in a direction in which the electrode fingers extend; and the third metal layer is disposed in the low-acoustic-velocity portions.

In another specific aspect of an acoustic wave device according to a preferred embodiment of the present invention, the acoustic wave device further includes a dielectric film disposed on a principal surface of the piezoelectric body to cover the IDT electrode.

In another broad aspect of an acoustic wave device according to a preferred embodiment of the present invention, the acoustic wave device includes a piezoelectric body and an IDT electrode disposed on the piezoelectric body. The IDT electrode includes a first metal layer disposed adjacent to the piezoelectric body, a second metal layer disposed on the first metal layer, and a third metal layer disposed on the second metal layer. The second metal layer includes an overhanging portion projecting outward from an outer edge of the first metal layer; and the overhanging portion extends in a direction away from the piezoelectric body, or extends parallel or substantially parallel to a direction in which a principal surface of the piezoelectric body extends.

In another specific aspect of an acoustic wave device according to a preferred embodiment of the present invention, the second metal layer includes a first barrier layer disposed on the first metal layer and a second barrier layer disposed on the first barrier layer.

In another specific aspect of an acoustic wave device according to a preferred embodiment of the present invention, the second barrier layer includes a side surface that connects a surface of the second barrier layer adjacent to the first barrier layer to a surface of the second barrier layer adjacent to the third metal layer; and at least a portion of an end portion of the side surface of the second barrier layer, the end portion being adjacent to the first barrier layer, is located closer to the third metal layer than a portion of the second barrier layer in contact with the first barrier layer.

In another specific aspect of an acoustic wave device according to a preferred embodiment of the present invention, the acoustic wave device further includes a metal oxide layer interposed between the first barrier layer and the second barrier layer.

In another specific aspect of an acoustic wave device according to a preferred embodiment of the present invention, the IDT electrode includes first and second busbars arranged opposite to each other, a plurality of first electrode fingers each connected at one end thereof to the first busbar, and a plurality of second electrode fingers interdigitated with the plurality of first electrode fingers and each connected at one end thereof to the second busbar; in the IDT electrode, a region where the first and second electrode fingers overlap as viewed in an elastic wave propagation direction is an overlap region; the overlap region includes a central area where an acoustic velocity of elastic waves is relatively high, and low-acoustic-velocity portions where the acoustic velocity is lower than in the central area, the low-acoustic-velocity portions being disposed at both ends of the central area in a direction in which the electrode fingers extend; and the third metal layer is disposed in the low-acoustic-velocity portions.

Preferred embodiments of the present invention provide acoustic wave devices that reduce or prevent electrochemical migration in an IDT electrode.

The above and other elements, features, steps, characteristics and advantages of the present invention will become more apparent from the following detailed description of the preferred embodiments with reference to the attached drawings.

DETAILED DESCRIPTION OF THE PREFERRED EMBODIMENTS

Hereinafter, the present invention will be explained by describing preferred embodiments of the present invention with reference to the drawings.

Note that the preferred embodiments described in the present specification are for illustrative purposes and some of configurations presented in different preferred embodiments may be replaced or combined.

Figure 1:
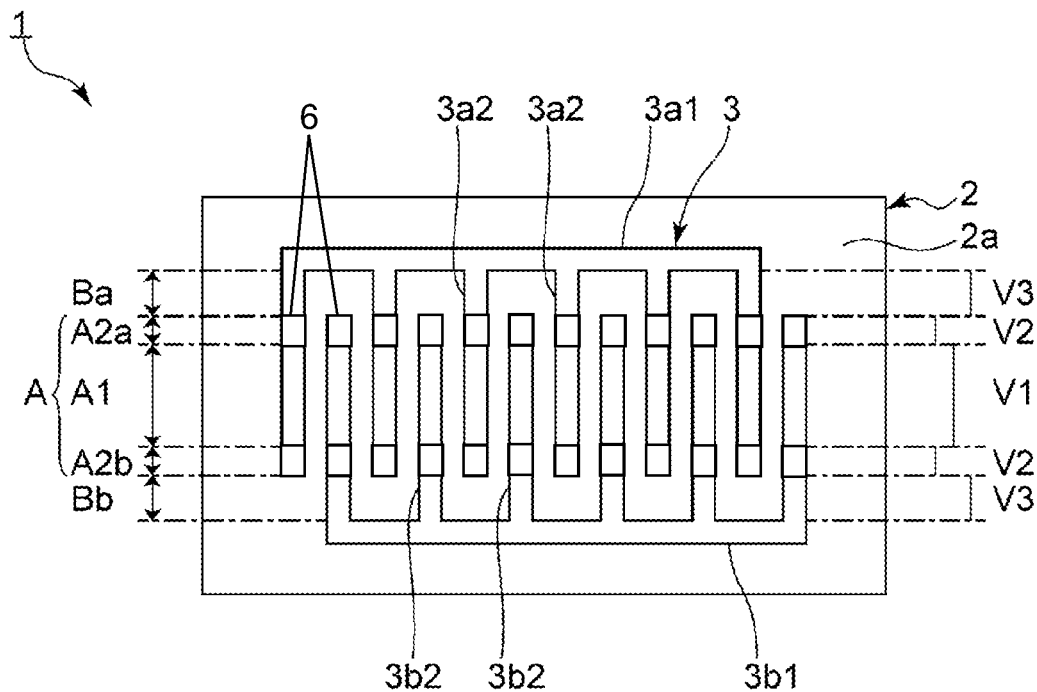
FIG. 1 is a plan view of an acoustic wave device according to a first preferred embodiment of the present invention.

FIG. 1 is a plan view of an acoustic wave device according to a first preferred embodiment of the present invention. Note that a dielectric layer (described below) is omitted in FIG. 1.

An acoustic wave device 1 includes a piezoelectric substrate 2 defining and functioning as a piezoelectric body. The piezoelectric substrate 2 is made of LiNbO$_3$. The piezoelectric substrate 2 may be made of a piezoelectric single crystal other than LiNbO$_3$, such as LiTaO$_3$, or may be made of an appropriate piezoelectric material, such as AlN, ZnO, PZT, or potassium sodium niobate. The piezoelectric body of the acoustic wave device 1 may be a piezoelectric thin film.

The piezoelectric substrate 2 has a principal surface 2a as one of principal surfaces. An IDT electrode 3 is disposed on the principal surface 2a. In the present preferred embodiment, the IDT electrode 3 is directly disposed on the piezoelectric substrate 2. The IDT electrode 3 includes first and second busbars 3a1 and 3b1, and a plurality of first electrode fingers 3a2 and a plurality of second electrode fingers 3b2. The first and second busbars 3a1 and 3b1 are arranged opposite to each other. The first electrode fingers 3a2 are each connected at one end thereof to the first busbar 3a1, and the second electrode fingers 3b2 are each connected at one end thereof to the second busbar 3b1. The first electrode fingers 3a2 and the second electrode fingers 3b2 are interdigitated with each other.

A region where the first electrode fingers 3a2 and the second electrode fingers 3b2 overlap as viewed in the elastic wave propagation direction is an overlap region A. The overlap region A includes a central area A1 where the acoustic velocity of elastic waves is relatively high. The overlap region A includes first and second low-acoustic-velocity portions A2a and A2b where the acoustic velocity is lower than in the central area A1. The first and second low-acoustic-velocity portions A2a and A2b are disposed at both ends of the central area A1 in the direction in which the first and second electrode fingers 3a2 and 3b2 extend. The IDT electrode 3 includes first and second high-acoustic-velocity portions Ba and Bb where the acoustic velocity is higher than in the central area A1. The first and second high-acoustic-velocity portions Ba and Bb are located on both sides of the overlap region A. More specifically, the first high-acoustic-velocity portion Ba is a gap region between the first busbar 3a1 and end portions of the second electrode fingers 3b2. The second high-acoustic-velocity portion Bb is a gap region between the second busbar 3b1 and end portions of the first electrode fingers 3a2.

Here, the acoustic velocity in the central area A1 is denoted by V1, the acoustic velocity in the first and second low-acoustic-velocity portions A2a and A2b is denoted by V2, and the acoustic velocity in the first and second high-acoustic-velocity portions Ba and Bb is denoted by V3. In FIG. 1, the more rightward the solid line representing the acoustic velocity, the higher the acoustic velocity. FIG. 1 shows that the relation V3>V1>V2 is satisfied.

Figure 2:
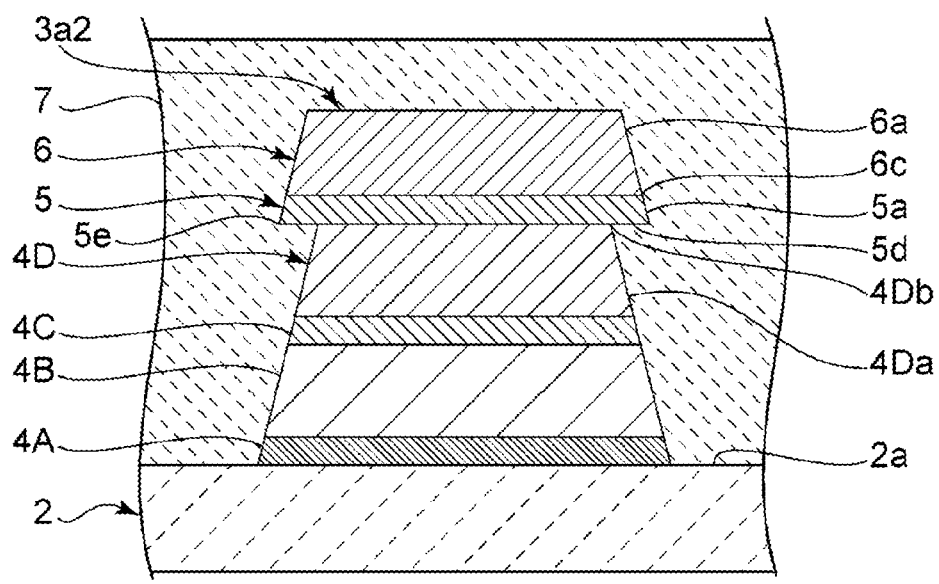
FIG. 2 is a cross-sectional view of a first electrode finger of an IDT electrode at a second low-acoustic-velocity portion, according to the first preferred embodiment of the present invention.
Figure 3:
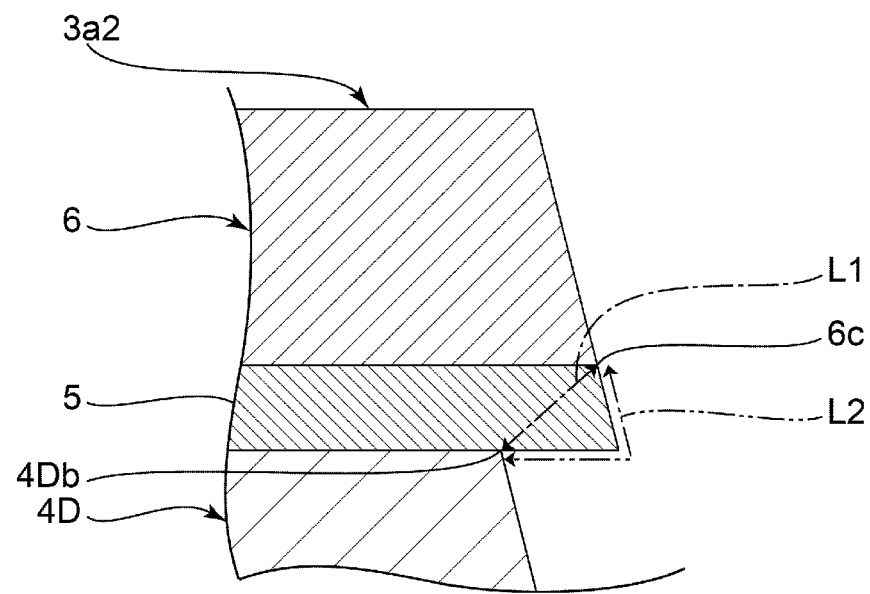
FIG. 3 is an enlarged view of FIG. 2.

FIG. 2 is a cross-sectional view of a first electrode finger of the IDT electrode at the second low-acoustic-velocity portion, according to the first preferred embodiment. FIG. 3 is an enlarged view of FIG. 2. Note that a dielectric film (described below) is omitted in FIG. 3.

The IDT electrode includes a plurality of first metal layers 4A to 4D disposed on the piezoelectric substrate 2. More specifically, the first metal layer 4A is disposed on the principal surface 2a of the piezoelectric substrate 2, and the first metal layer 4B is disposed on the first metal layer 4A. Additionally, the first metal layer 4C is disposed on the first metal layer 4B, and the first metal layer 4D is disposed on the first metal layer 4C. In the present preferred embodiment, the first metal layer 4A is made of NiCr. The first metal layer 4B is made of Pt. The first metal layer 4C is made of Ti. The first metal layer 4D is made of AlCu. The materials used to form the first metal layers 4A to 4D are not limited to them. The IDT electrode may have any configuration as long as it includes at least one first metal layer.

The IDT electrode further includes a second metal layer 5 disposed on a side of the first metal layer 4D opposite the piezoelectric substrate 2, and a third metal layer 6 disposed on the second metal layer 5. The second metal layer 5 is a barrier layer that reduces diffusion of metal of the third metal layer 6 into the first metal layer 4D. In the present preferred embodiment, the second metal layer 5 is made of Ti. The third metal layer 6 is made of Pt. The materials used to form the second and third metal layers 5 and 6 are not limited to them.

A dielectric film 7 is disposed on the principal surface 2a of the piezoelectric substrate 2. The dielectric film 7 covers the IDT electrode. The dielectric film 7 is made of $SiO_2$, but is not particularly limited to this. The dielectric film 7 is optional and may not be provided.

The first metal layer 4D includes a side surface 4Da that connects a surface of the first metal layer 4D adjacent to the piezoelectric substrate 2 to a surface of the first metal layer 4D adjacent to the second metal layer 5. The first metal layers 4A to 4C each similarly include a side surface. The second metal layer 5 includes a side surface 5a that connects a surface of the second metal layer 5 adjacent to the first metal layer 4D to a surface of the second metal layer 5 adjacent to the third metal layer 6. The third metal layer 6 includes a side surface 6a that connects a surface of the third metal layer 6 adjacent to the second metal layer 5 to a surface of the third metal layer 6 opposite the second metal layer 5. The side surfaces of the first metal layers 4A to 4C, the side surface 4Da of the first metal layer 4D, and the side surfaces 5a and 6a of the second and third metal layers 5 and 6 are inclined with respect to the normal direction of the principal surface 2a of the piezoelectric substrate 2. Note that the side surfaces described above do not necessarily need to be inclined with respect to the normal direction of the principal surface 2a of the piezoelectric substrate 2.

The side surface 4Da of the first metal layer 4D includes an end portion 4Db which is an end portion thereof adjacent to the second metal layer 5. The side surface 6a of the third metal layer 6 includes a second end portion 6c which is an end portion thereof adjacent to the second metal layer 5.

The side surface 5a of the second metal layer 5 is located outside the first end portion 4Db in plan view. The surface of the second metal layer 5 adjacent to the first metal layer 4D includes a noncontact portion 5d not in contact with the first metal layer 4D. In the present preferred embodiment, the noncontact portion 5d extends in a direction parallel or substantially parallel to the direction in which the principal surface 2a of the piezoelectric substrate 2 extends. In other words, the second metal layer 5 includes an overhanging portion 5e projecting outward from the first metal layer 4D and extending parallel or substantially parallel to the direction in which the principal surface 2a extends.

As illustrated in FIG. 3, a distance between the first end portion 4Db and the second end portion 6c is denoted by L1. A creepage distance stretching from the first end portion 4Db to the second end portion 6c, via the noncontact portion 5d and the side surface 5a of the second metal layer 5 illustrated in FIG. 2, is denoted by L2. The first electrode finger 3a2 includes a portion where the distance L2 is longer than the distance L1. The first, second, and third metal layers 4A to 4D, 5, and 6 in the first and second electrode fingers, other than the first electrode finger 3a2 illustrated in FIGS. 2 and 3, are configured in the same manner as those in the first electrode finger 3a2.

More specifically, in the present preferred embodiment, the second and third metal layers 5 and 6 are provided in the first and second low-acoustic-velocity portions A2a and A2b illustrated in FIG. 1, and not in the central area A1. This makes the acoustic velocity in the first and second low-acoustic-velocity portions A2a and A2b lower than that in the central area A1.

The first high-acoustic-velocity portion Ba includes the first electrode fingers 3a2 and does not include the second electrode fingers 3b2. The second high-acoustic-velocity portion Bb includes the second electrode fingers 3b2 and does not include the first electrode fingers 3a2. The second and third metal layers 5 and 6 illustrated in FIG. 2 are not provided in the first and second high-acoustic-velocity portions Ba and Bb. This makes the acoustic velocity in the first and second high-acoustic-velocity portions Ba and Bb higher than those in the central area A1 and the first and second low-acoustic-velocity portions A2a and A2b. The first and second low-acoustic-velocity portions A2a and A2b are disposed outside the central area A1, and the first and second high-acoustic-velocity portions Ba and Bb are disposed outside the first and second low-acoustic-velocity portions A2a and A2b. This enables effective confinement of the energy of elastic waves.

In the present preferred embodiment, as illustrated in FIG. 3, the distance L2 is longer than the distance L1 throughout the outer periphery of the third metal layer 6 in plan view.

The positions of the second and third metal layers 5 and 6 are not limited to those described above. The second and third metal layers 5 and 6 may be located anywhere as long as they are provided in at least a portion of the IDT electrode 3. For example, the second and third metal layers 5 and 6 may be located outside the first and second low-acoustic-velocity portions A2a and A2b.

In the acoustic wave device 1, the overhanging portion 5e projects outward from the outer edge of the surface of the first metal layer 4D in contact with the second metal layer 5. In this case, the overhanging portion 5e projects outward from the outer edge of the surface of the first metal layer 4D in contact with the second metal layer 5 throughout the outer edge. This means that the overhanging portion 5e has a frame-shaped structure in plan view as seen from the third metal layer 6. The overhanging portion 5e may thus be structured to project outward from the outer edge of the first metal layer 4D, and may extend parallel or substantially parallel or substantially parallel to the direction extending from the principal surface of the piezoelectric substrate 2, or may extend in a direction away from the piezoelectric substrate 2. This also reduces electrochemical migration from the third metal layer 6 to the first metal layer 4D.

The present preferred embodiment is structured such that the distance L2 is longer than the distance L1 in at least a portion of the IDT electrode 3. In the IDT electrode 3, this reduces or prevents electrochemical migration of metal atoms from the third metal layer 6 illustrated in FIG. 2 to the first metal layer 4D. This will now be explained by comparing the present preferred embodiment with a comparative example.

Figure 4:
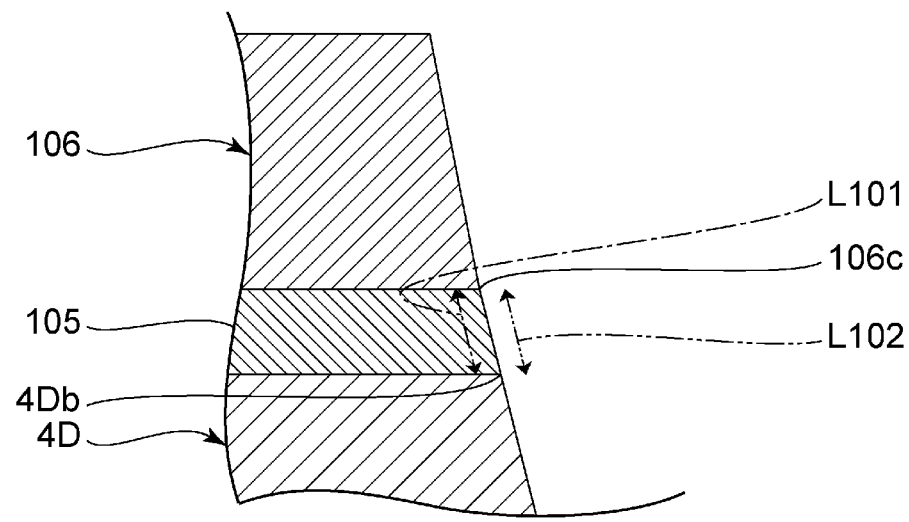
FIG. 4 is a cross-sectional view of an electrode finger of an IDT electrode according to a comparative example.

FIG. 4 is a cross-sectional view of an electrode finger of an IDT electrode according to a comparative example.

In the comparative example, a surface of a second metal layer 105 adjacent to the first metal layer 4D does not have the noncontact portion. A distance L101 between the first end portion 4Db of the first metal layer 4D and a second end portion 106c of a third metal layer 106 is equal to a creepage distance L102 stretching from the first end portion 4Db to the second end portion 106c via the side surface of the second metal layer 105. Except for this, the acoustic wave device of the comparative example has the same configuration as the acoustic wave device 1 of the first preferred embodiment.

In the comparative example, where the distance L101 and the distance L102 are equal, Al atoms in the first metal layer 4D may move by surface diffusion along the side surface of the second metal layer 105 and easily reach the third metal layer 106. In this case, Al is alloyed with Pt. This increases the electrical resistance of the IDT electrode and tends to deteriorate electrical characteristics of the IDT electrode.

In the first preferred embodiment, as illustrated in FIG. 3, the distance L2 is longer than the distance L1. This increases the distance of migration of Al atoms from the first metal layer 4D to the third metal layer 6, or the distance of migration of Pt atoms from the third metal layer 6 to the first metal layer 4D and thus reduces or prevents electrochemical migration.

Figure 5:
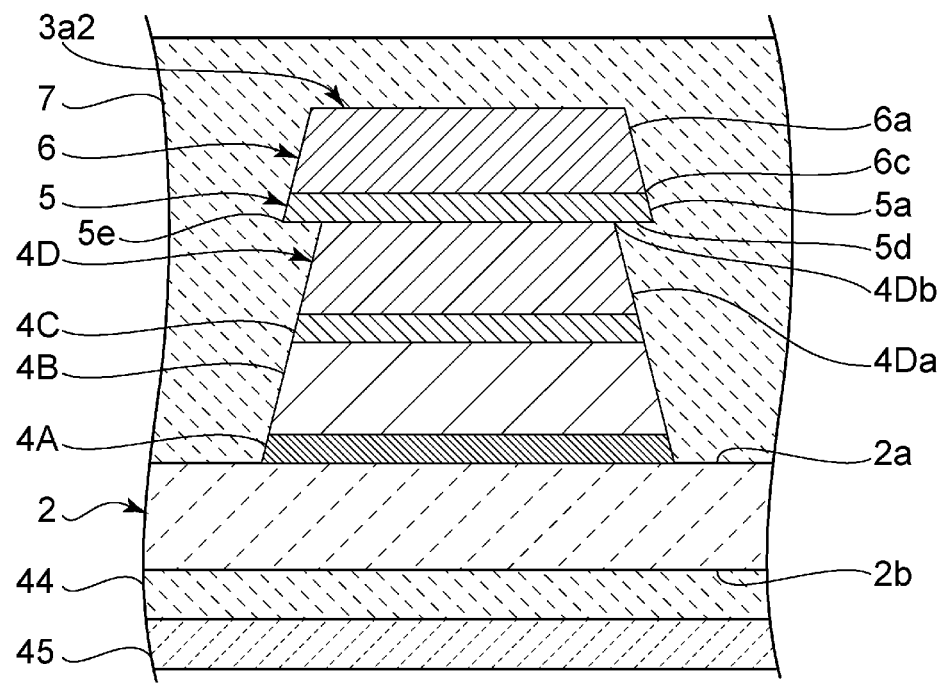
FIG. 5 is a cross-sectional view of the first electrode finger of the IDT electrode according to a modification of the first preferred embodiment of the present invention.

As in a modification of the first preferred embodiment illustrated in FIG. 5, a principal surface 2b of the piezoelectric substrate 2 opposite the principal surface 2a may be provided with a low-acoustic-velocity film 44 thereon. A high-acoustic-velocity member 45 may be added onto a side of the low-acoustic-velocity film 44 opposite the piezoelectric substrate 2. The low-acoustic-velocity film 44 is a film where the acoustic velocity of bulk waves propagating therethrough is lower than the acoustic velocity of elastic waves propagating through the piezoelectric substrate 2. The high-acoustic-velocity member 45 is a component where the acoustic velocity of bulk waves propagating therethrough is higher than the acoustic velocity of elastic waves propagating through the piezoelectric substrate 2. The high-acoustic-velocity member 45 may be a high-acoustic-velocity film or substrate. With the low-acoustic-velocity film 44 and the high-acoustic-velocity member 45, the energy of elastic waves is effectively confined.

The principal surface 2b of the piezoelectric substrate 2 may be provided with an acoustic multilayer film thereon. The acoustic multilayer film is a film formed by alternately stacking low acoustic impedance layers having a relatively low acoustic impedance and high acoustic impedance layers having a relatively high acoustic impedance. This configuration also enables effective confinement of the energy of elastic waves.

The piezoelectric substrate 2 may be disposed, for example, on a support substrate including a recessed portion. This may form a cavity surrounded by the recessed portion and the piezoelectric substrate 2. The IDT electrode 3 may be disposed to overlap the cavity in plan view.

The piezoelectric substrate 2 and the IDT electrode 3 may be provided with a dielectric layer therebetween which is made of $SiO_2$ or the like. This enables the use of, for example, Love waves. The IDT electrode 3 may thus be indirectly disposed on the piezoelectric substrate 2.

Hereinafter, a non-limiting example of a method for manufacturing the acoustic wave device 1 according to the first preferred embodiment will be described.

Figure 6A:
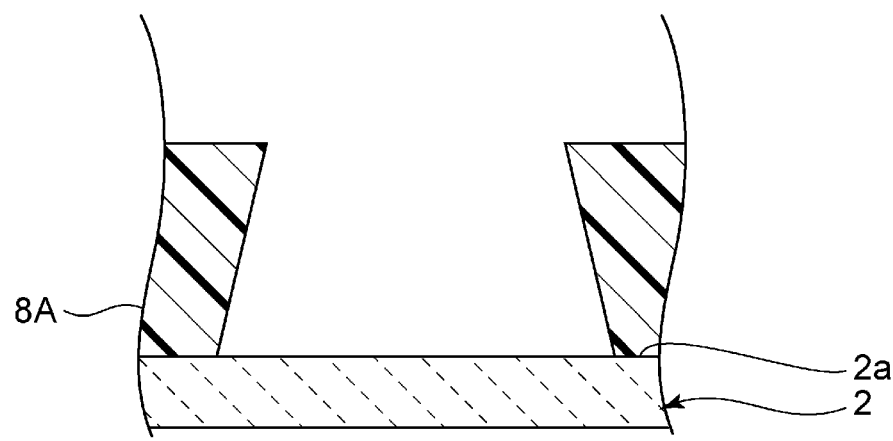
FIGS. 6A to 6C are front cross-sectional views for explaining a method for manufacturing the acoustic wave device according to the first preferred embodiment of the present invention.
Figure 6B:
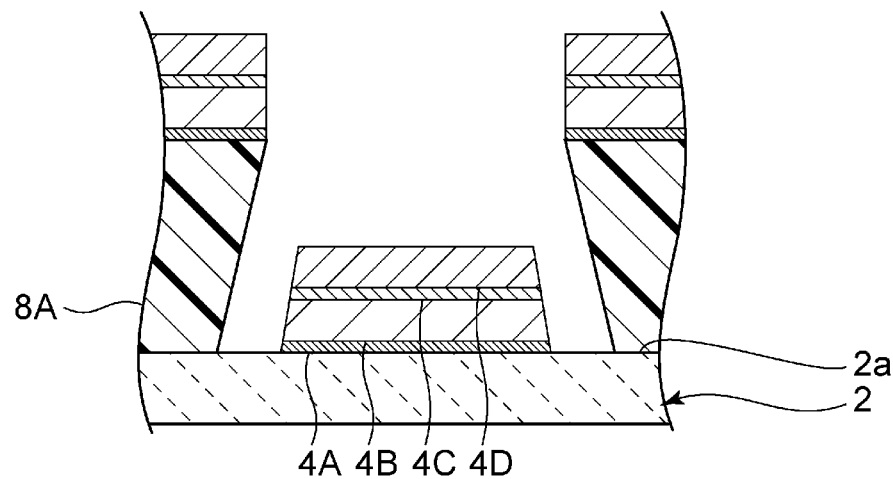
Figure 6C:
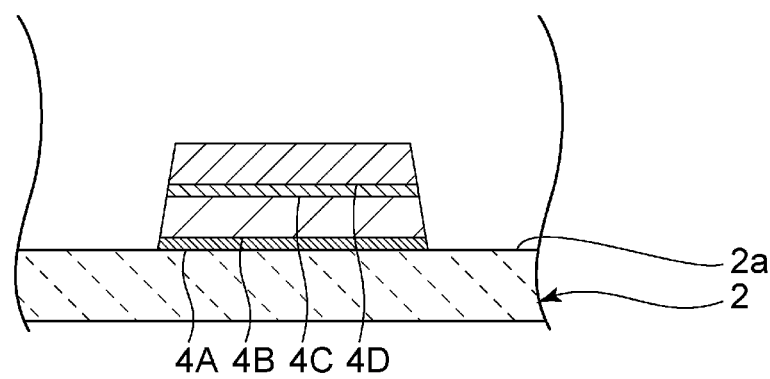

FIGS. 6A to 6C are front cross-sectional views for explaining a method for manufacturing the acoustic wave device according to the first preferred embodiment. FIGS. 7A to 7D are front cross-sectional views for explaining the non-limiting example of the method for manufacturing the acoustic wave device according to the first preferred embodiment. Note that FIGS. 6A to 6C and FIGS. 7A to 7D are cross-sectional views taken at the second low-acoustic-velocity portion A2b in FIG. 1.

As illustrated in FIG. 6A, the piezoelectric substrate 2 is prepared. Next, a resist pattern 8A is formed by photolithography on the principal surface 2a of the piezoelectric substrate 2. In the cross-section illustrated in FIG. 6A, a gap is formed between opposite portions of the resist pattern 8A. In the present preferred embodiment, the side surface of the resist pattern 8A is inclined in such a manner that the distance between the opposite portions of the resist pattern 8A, with the gap therebetween, increases with decreasing distance to the piezoelectric substrate 2. The direction of inclination of the side surface of the resist pattern 8A is not limited to this. The side surface of the resist pattern 8A does not necessarily need to be inclined.

Next, as illustrated in FIG. 6B, the first metal layer 4A is formed on the piezoelectric substrate 2. Next, the first metal layer 4B is formed on the first metal layer 4A. Next, the first metal layer 4C is formed on the first metal layer 4B. Then, the first metal layer 4D is formed on the first metal layer 4C. The first metal layers 4A to 4D can be formed, for example, by vacuum deposition. At the same time, the metal materials used to form the first metal layers 4A to 4D are deposited on the resist pattern 8A.

Figure 7A:
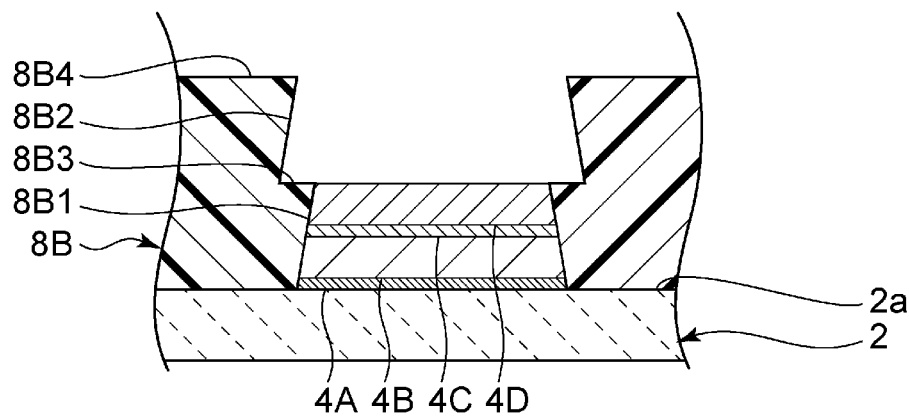
FIGS. 7A to 7D are other front cross-sectional views for explaining the method for manufacturing the acoustic wave device according to the first preferred embodiment of the present invention.

Next, as illustrated in FIG. 6C, the resist pattern 8A is peeled off the piezoelectric substrate 2. Next, as illustrated in FIG. 7A, a resist pattern 8B is formed by photolithography on the principal surface 2a of the piezoelectric substrate 2.

The resist pattern 8B is patterned in such a manner that the side surface of the resist pattern 8B is shaped into two steps. The resist pattern 8B includes a first step portion 8B1 which is the first step from the piezoelectric substrate 2, a second step portion 8B2 which is the second step from the piezoelectric substrate 2, and a connecting portion 8B3 that connects the first and second step portions 8B1 and 8B2. The resist pattern 8B also has an upper surface 8B4 connected to the upper portion of the second step portion 8B2 in FIG. 7A.

The first step portion 8B1 is in contact with the side surfaces of the first metal layers 4A to 4D at one side thereof extending from an end adjacent to the piezoelectric substrate 2 to an end connected to the connecting portion 8B3. The first and second step portions 8B1 and 8B2 are inclined similarly to the side surface of the resist pattern 8A illustrated in FIG. 6A. The direction of inclination of the first and second step portions 8B1 and 8B2 is not limited to that described above. The first and second step portions 8B1 and 8B2 do not necessarily need to be inclined.

The connecting portion 8B3 extends parallel or substantially parallel or substantially parallel to the direction in which the principal surface 2a of the piezoelectric substrate 2 extends. The connecting portion 8B3 and the surface of the first metal layer 4D opposite the piezoelectric substrate 2 form a surface parallel or substantially parallel to the principal surface 2a of the piezoelectric substrate 2.

In the method for manufacturing the acoustic wave device 1 of the present preferred embodiment, the entire first metal layer 4D, except the first and second low-acoustic-velocity portions A2a and A2b illustrated in FIG. 1, is covered with the resist pattern 8B.

Figure 7B:
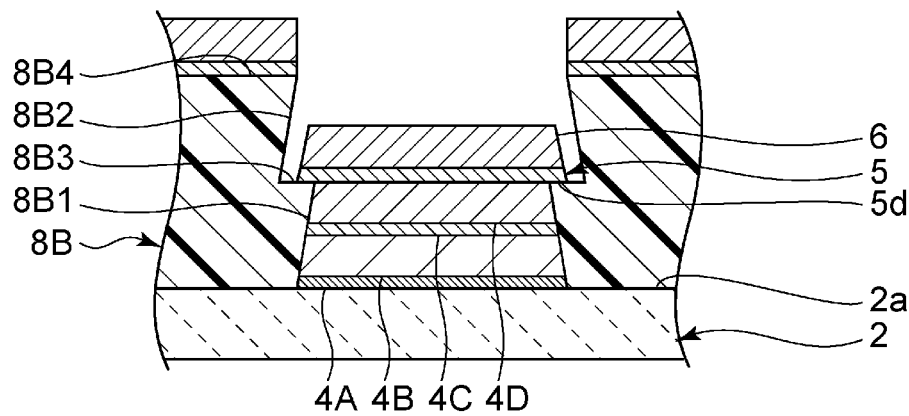

Next, as illustrated in FIG. 7B, the second metal layer 5 is formed, for example, by vacuum deposition on the surface formed by the connecting portion 8B3 and the surface of the first metal layer 4D opposite the piezoelectric substrate 2. A portion of the second metal layer 5 disposed on the connecting portion 8B3 is the noncontact portion 5d.

Next, the third metal layer 6 is formed on the second metal layer 5 by vacuum deposition or the like. In the steps of forming the second and third metal layers 5 and 6, the metal materials used to form the second and third metal layers 5 and 6 are also deposited on the upper surface 8B4 of the resist pattern 8B.

Figure 7C:
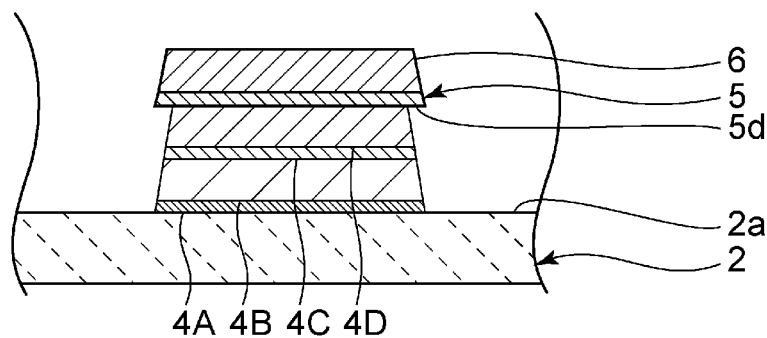
Figure 7D:
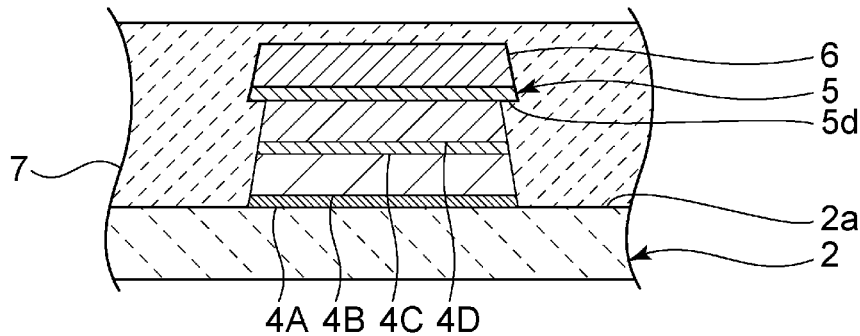

Next, as illustrated in FIG. 7C, the resist pattern 8B is peeled off the piezoelectric substrate 2. An IDT electrode is thus obtained. Next, as illustrated in FIG. 7D, the dielectric film 7 is formed on the principal surface 2a of the piezoelectric substrate 2 so as to cover the IDT electrode. The dielectric film 7 can be formed, for example, by vacuum deposition or sputtering.

As described above, the IDT electrode may have any configuration as long as it includes at least one first metal layer, and the materials used to form the first, second, and third metal layers 4A to 4D, 5, and 6 are not limited to those described above. For example, the IDT electrode does not necessarily need to include the first metal layers 4C and 4D. More specifically, the third metal layer 6 made of Pt may be formed on the first metal layer 4B made of Pt, with the second metal layer 5 interposed therebetween. Even in this case, it is still possible to reduce electrochemical migration in the IDT electrode. This reduces or prevents the formation of voids in the first metal layer 4B. Thus, even when the first metal layer 4B and the third metal layer 6 contain the same metal, it is possible to reduce deterioration of electrical characteristics of the IDT electrode.

When the IDT electrode does not include the first metal layers 4C and 4D, the first metal layer 4B may be made of Al and the third metal layer 6 may also be made of Al. The first metal layer 4A may be made of Al, the first metal layer 4B may be made of Mo, and the third metal layer 6 may also be made of Mo. The first metal layer 4A may be made of Ti, the first metal layer 4B may be made of Cu, and the third metal layer 6 may also be made of Cu. In these cases, it is still possible to reduce electrochemical migration in the IDT electrode.

Figure 8:
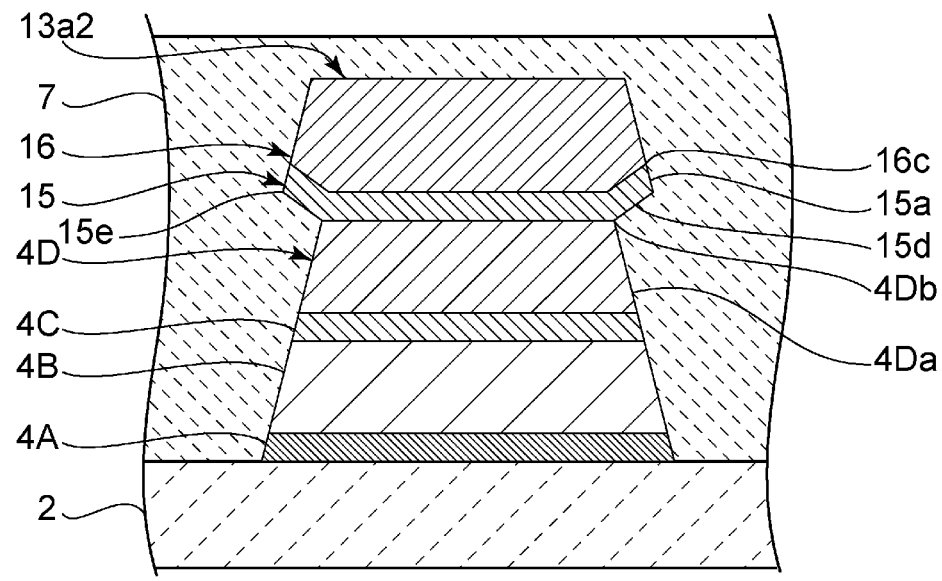
FIG. 8 is a cross-sectional view of a first electrode finger of an IDT electrode in an acoustic wave device according to a second preferred embodiment of the present invention.

FIG. 8 is a cross-sectional view of a first electrode finger of an IDT electrode in an acoustic wave device according to a second preferred embodiment of the present invention.

The acoustic wave device of the present preferred embodiment differs from that of the first preferred embodiment in the shapes of second and third metal layers 15 and 16 in a first electrode finger 13a2 of the IDT electrode. First and second electrode fingers, other than the first electrode finger 13a2 illustrated in FIG. 8, are configured in the same manner as the first electrode finger 13a2 illustrated in FIG. 8. Except for the point described above, the acoustic wave device of the present preferred embodiment has the same configuration as the acoustic wave device 1 of the first preferred embodiment.

The direction in which a noncontact portion 15d of the second metal layer 15 extends intersects the direction in which the principal surface 2a of the piezoelectric substrate 2 extends. More specifically, the noncontact portion 15d extends farther from the piezoelectric substrate 2 with decreasing distance to a side surface 15a. In other words, an overhanging portion 15e of the second metal layer 15 extends farther from the piezoelectric substrate 2 with decreasing distance to the side surface 15a.

This increases the length from an end of the noncontact portion 15d adjacent to the first metal layer 4D to an end of the noncontact portion 15d adjacent to the side surface 15a. This further increases the creepage distance from the first end portion 4Db of the first metal layer 4D to a second end portion 16c of the third metal layer 16. It is thus possible to further reduce electrochemical migration in the IDT electrode.

The dielectric film 7 is deposited on the piezoelectric substrate 2. Since the noncontact portion 15d extends farther from the piezoelectric substrate 2 with decreasing distance to the side surface 15a, the dielectric film 7 is able to easily come into contact with the noncontact portion 15d. This prevents easy formation of a gap between the IDT electrode and the dielectric film 7, and further reduces deterioration of electrical characteristics of the IDT electrode.

Figure 9:
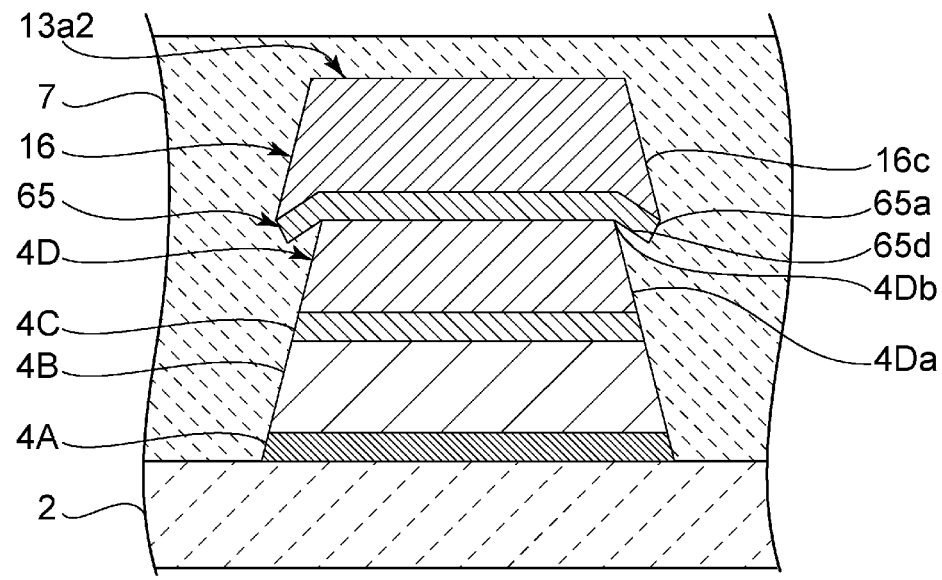
FIG. 9 is a cross-sectional view of the first electrode finger of the IDT electrode in the acoustic wave device according to a modification of the second preferred embodiment of the present invention.

As in a modification of the second preferred embodiment illustrated in FIG. 9, a noncontact portion 65d of a second metal layer 65 may extend toward the piezoelectric substrate 2 with decreasing distance to a side surface 65a.

Figure 10:
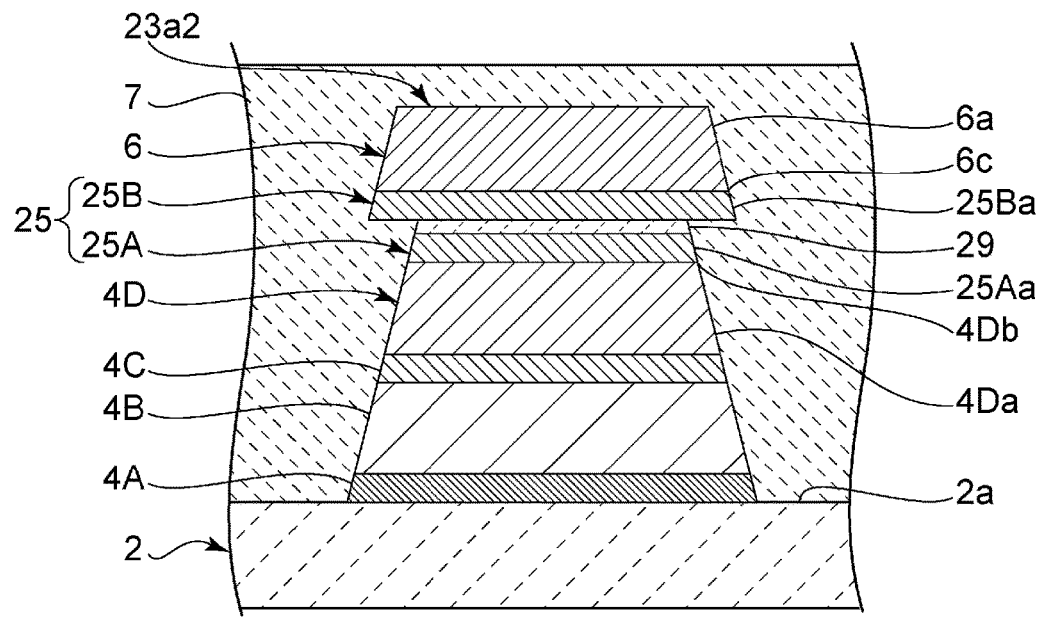
FIG. 10 is a cross-sectional view of a first electrode finger of an IDT electrode in an acoustic wave device according to a third preferred embodiment of the present invention.

FIG. 10 is a cross-sectional view of a first electrode finger of an IDT electrode in an acoustic wave device according to a third preferred embodiment of the present invention.

The acoustic wave device of the present preferred embodiment differs from that of the first preferred embodiment in that a second metal layer 25 in a first electrode finger 23a2 of the IDT electrode includes first and second barrier layers 25A and 25B and that the IDT electrode includes a metal oxide layer 29. First and second electrode fingers, other than the first electrode finger 23a2 illustrated in FIG. 10, are configured in the same manner as the first electrode finger 23a2 illustrated in FIG. 10. Except for the points described above, the acoustic wave device of the present preferred embodiment has the same configuration as the acoustic wave device 1 of the first preferred embodiment.

The first barrier layer 25A is disposed on the first metal layer 4D. The metal oxide layer 29 is disposed on the first barrier layer 25A. The second barrier layer 25B is disposed on the metal oxide layer 29. The third metal layer 6 is disposed on the second barrier layer 25B.

In the present preferred embodiment, the first and second barrier layers 25A and 25B are made of Ti and the metal oxide layer 29 is made of titanium oxide. The first and second barrier layers 25A and 25B may be made of any appropriate metal that reduces or prevents diffusion of metal atoms between metals. The metal oxide layer 29 may be made of any appropriate metal that reduces or prevents diffusion of metal atoms between metals.

The first barrier layer 25A includes a side surface 25Aa that connects a surface of the first barrier layer 25A adjacent to the piezoelectric substrate 2 to a surface of the first barrier layer 25A adjacent to the third metal layer 6. In plan view, the side surface 25Aa is not located outside the first end portion 4Db of the first metal layer 4D.

The second barrier layer 25B includes a side surface 25Ba that connects a surface of the second barrier layer 25B adjacent to the piezoelectric substrate 2 to a surface of the second barrier layer 25B adjacent to the third metal layer 6. The side surface 25Ba is located outside the first end portion 4Db in plan view. This further increases the creepage distance from the first end portion 4Db to the second end portion 6c of the third metal layer 6. It is thus possible to further reduce electrochemical migration in the IDT electrode.

Note that the side surface 25Aa of the first barrier layer 25A may be located outside the first end portion 4Db of the first metal layer 4D in plan view.

In the present preferred embodiment, as described above, the first barrier layer 25A and the second barrier layer 25B are provided with the metal oxide layer 29 therebetween. This makes it possible to further reduce diffusion of metal atoms from the third metal layer 6 through the second metal layer 25 into the first metal layer 4D.

In manufacturing the acoustic wave device of the present preferred embodiment, for example, the step of forming the first metal layers 4A to 4D illustrated in FIG. 6B may be followed by forming the first barrier layer 25A on the first metal layer 4D before the resist pattern 8A is peeled off. The first barrier layer 25A may be formed, for example, by vacuum deposition.

Next, the step of oxidizing the surface of the first barrier layer 25A opposite the first metal layer 4D is performed. The metal oxide layer 29 is thus able to be obtained. This is followed by the steps illustrated in FIG. 6C and FIG. 7A. Then, by the same method as that used in the step illustrated in FIG. 7B, the second barrier layer 25B is formed on the metal oxide layer 29. Note that the step of oxidizing, described above, may be performed any time before the second barrier layer 25B is formed. The acoustic wave device of the present preferred embodiment is thus able to be obtained by the same method as that used in the steps illustrated in FIGS. 7C and 7D.

Figure 11:
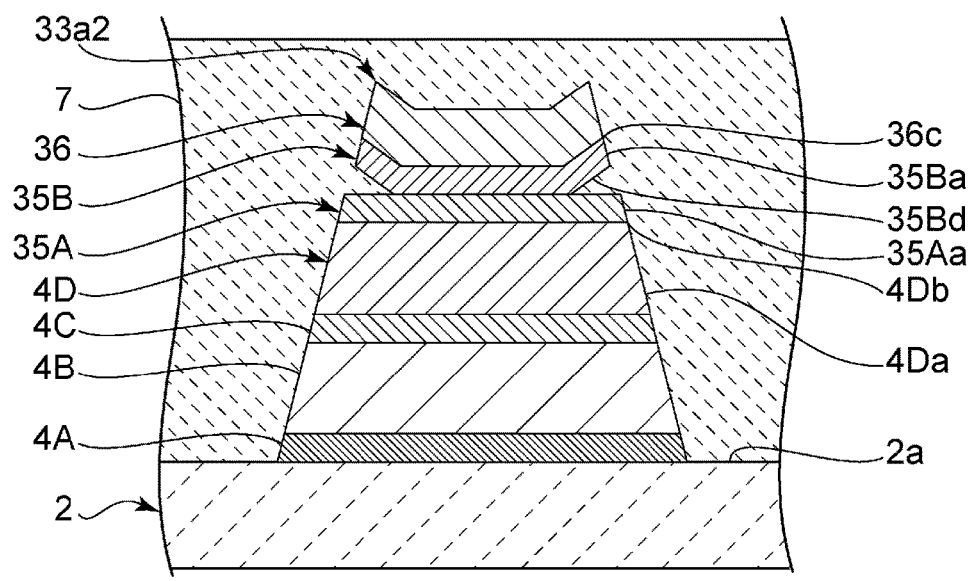
FIG. 11 is a cross-sectional view of a first electrode finger of an IDT electrode in an acoustic wave device according to a fourth preferred embodiment of the present invention.

FIG. 11 is a cross-sectional view of a first electrode finger of an IDT electrode in an acoustic wave device according to a fourth preferred embodiment of the present invention.

The acoustic wave device of the present preferred embodiment differs from that of the third preferred embodiment in the shapes of a second barrier layer 35B and a third metal layer 36 in a first electrode finger 33a2 of the IDT electrode. The present preferred embodiment also differs from the third preferred embodiment in that the IDT electrode does not include a metal oxide layer. First and second electrode fingers, other than the first electrode finger 33a2 illustrated in FIG. 11, are configured in the same manner as the first electrode finger 33a2 illustrated in FIG. 11. Except for the points described above, the acoustic wave device of the present preferred embodiment has the same configuration as the acoustic wave device of the third preferred embodiment.

More specifically, an end portion of a side surface 35Ba of the second barrier layer 35B adjacent to a first barrier layer 35A is located closer to the third metal layer 36 than a portion of the second barrier layer 35B in contact with the first barrier layer 35A is. The second barrier layer 35B thus includes a raised portion 35Bd raised from the first barrier layer 35A. This increases the creepage distance from the first end portion 4Db of the first metal layer 4D to a second end portion 36c of the third metal layer 36. It is thus possible to effectively reduce electrochemical migration in the IDT electrode.

Additionally, like the second preferred embodiment described above, the present preferred embodiment is able to prevent easy formation of a gap between the IDT electrode and the dielectric film 7.

A portion of the third metal layer 36 overlapping the raised portion 35Bd in plan view protrudes in a direction away from the piezoelectric substrate 2. Note that the third metal layer 36 does not necessarily need to have such a protruding portion.

In the present preferred embodiment, side surfaces 35Aa and 35Ba of the first and second barrier layers 35A and 35B are not located outside the first end portion 4Db of the first metal layer 4D in plan view. The side surfaces 35Aa and 35Ba of the first and second barrier layers 35A and 35B may be located outside the first end portion 4Db of the first metal layer 4D in plan view.

The side surface 35Ba of the second barrier layer 35B is located inside the side surface 35Aa of the first barrier layer 35A in plan view. The side surface 35Ba of the second barrier layer 35B may be located outside the side surface 35Aa of the first barrier layer 35A in plan view.

Figure 12:
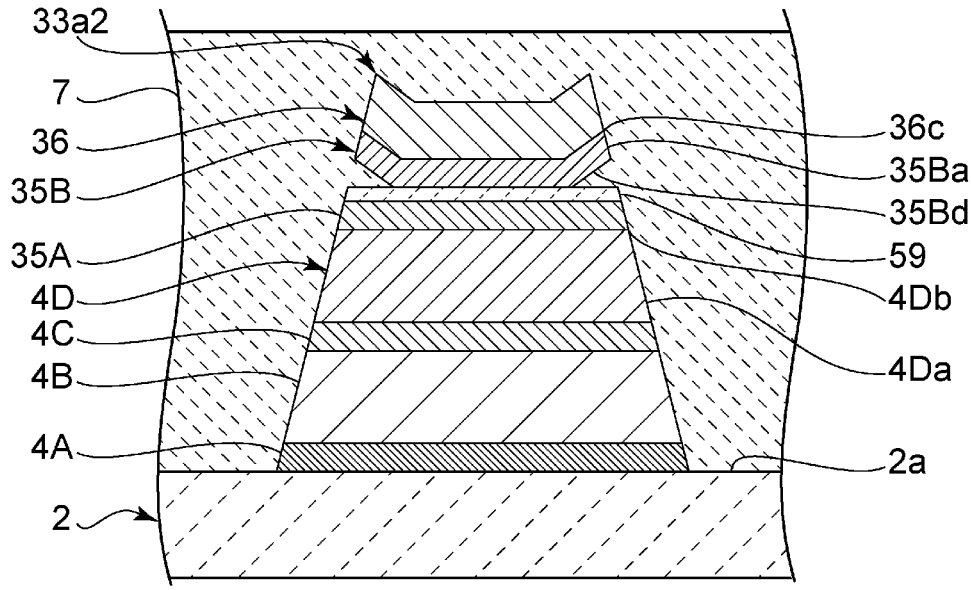
FIG. 12 is a cross-sectional view of the first electrode finger of the IDT electrode in the acoustic wave device according to a modification of the fourth preferred embodiment of the present invention.

As in a modification of the fourth preferred embodiment illustrated in FIG. 12, the first barrier layer 35A and the second barrier layer 35B may be provided with a metal oxide layer 59 therebetween, as in the third preferred embodiment described above.

Figure 13A:
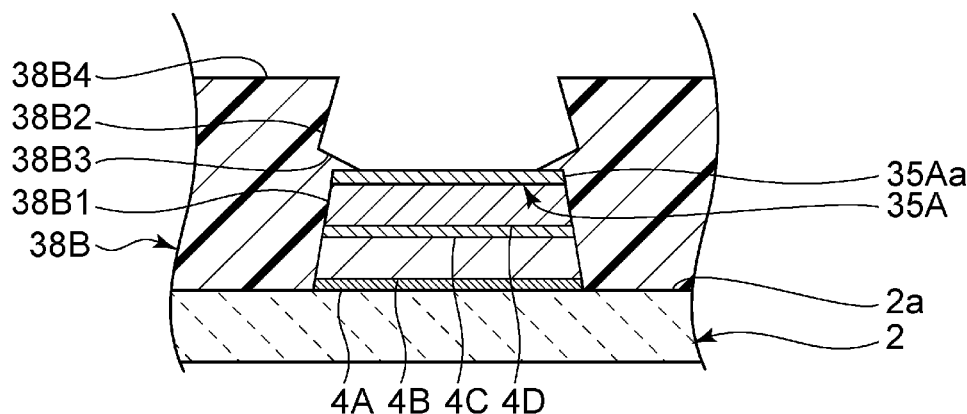
FIGS. 13A and 13B are front cross-sectional views for explaining a method for manufacturing the acoustic wave device according to the fourth preferred embodiment of the present invention.
Figure 13B:
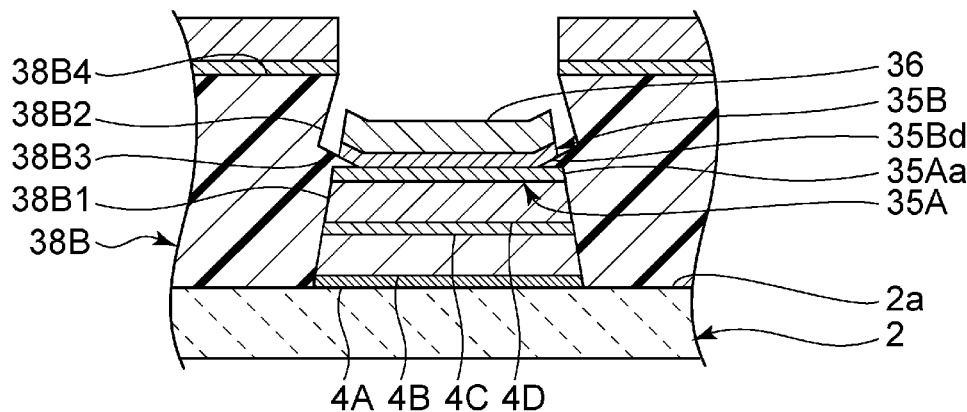

FIGS. 13A and 13B are front cross-sectional views for explaining a method for manufacturing the acoustic wave device according to the fourth preferred embodiment.

The acoustic wave device of the present preferred embodiment can be manufactured similarly to the acoustic wave device of the third preferred embodiment until the steps of forming the first metal layers 4A to 4D and the first barrier layer 35A. Next, as illustrated in FIG. 13A, a resist pattern 38B is formed on the piezoelectric substrate 2 by photolithography. The resist pattern 38B is patterned in such a manner that on the first barrier layer 35A, a portion of the resist pattern 38B is located near the side surface 35Aa of the first barrier layer 35A.

More specifically, as in the method for manufacturing the acoustic wave device of the first preferred embodiment, the resist pattern 38B includes first and second step portions 38B1 and 38B2 and an upper surface 38B4. The resist pattern 38B has a connecting portion 38B3 connecting the first and second step portions 38B1 and 38B2 and disposed on the first barrier layer 35A near the side surface 35Aa.

Next, as illustrated in FIG. 13B, the second barrier layer 35B is formed, for example, by vacuum deposition on the connecting portion 38B3 and the first barrier layer 35A. A portion of the second barrier layer 35B disposed on the connecting portion 38B3 is the raised portion 35Bd.

Next, the third metal layer 36 is formed on the second barrier layer 35B by vacuum deposition or the like. The acoustic wave device of the present preferred embodiment can thus be obtained by the same method as that used in the steps illustrated in FIGS. 7C and 7D.

While preferred embodiments of the present invention have been described above, it is to be understood that variations and modifications will be apparent to those skilled in the art without departing from the scope and spirit of the present invention. The scope of the present invention, therefore, is to be determined solely by the following claims.

What is claimed is:

1. An acoustic wave device comprising:
    a piezoelectric body; and
    an IDT electrode directly or indirectly disposed on the piezoelectric body; wherein
    the IDT electrode includes a first metal layer, a second metal layer disposed on the first metal layer, and a third metal layer disposed on the second metal layer;
    the first metal layer includes a side surface that connects a surface of the first metal layer adjacent to the piezoelectric body to a surface of the first metal layer adjacent to the second metal layer;
    the side surface of the first metal layer includes a first end portion adjacent to the second metal layer;
    the second metal layer includes a side surface that connects a surface of the second metal layer adjacent to the first metal layer to a surface of the second metal layer adjacent to the third metal layer;
    the third metal layer includes a side surface that connects a surface of the third metal layer adjacent to the second metal layer to a surface of the third metal layer opposite the second metal layer;
    the side surface of the third metal layer includes a second end portion adjacent to the second metal layer;
    the second end portion of the side surface of the third metal layer is directly connected to the side surface of the second metal layer; and
    in at least a portion of the IDT electrode, a creepage distance extending from the first end portion of the side surface of the first metal layer to the second end portion of the side surface of the third metal layer via the side surface of the second metal layer is longer than a distance between the first end portion of the side surface of the first metal layer and the second end portion of the side surface of the third metal layer.

2. The acoustic wave device according to claim 1, wherein throughout an outer periphery of the third metal layer in plan view, the creepage distance extending from the first end portion of the side surface of the first metal layer to the second end portion of the side surface of the third metal layer via the side surface of the second metal layer is longer than the distance between the first end portion of the side surface of the first metal layer and the second end portion of the side surface of the third metal layer.

3. The acoustic wave device according to claim 1, wherein the side surface of the second metal layer is located outside the second end portion of the side surface of the third metal layer in plan view, and the surface of the second metal layer adjacent to the first metal layer includes a noncontact portion not in contact with the first metal layer.

4. The acoustic wave device according to claim 3, wherein a direction in which the noncontact portion extends intersects a direction in which a principal surface of the piezoelectric body extends.

5. The acoustic wave device according to claim 4, wherein the noncontact portion extends farther from the piezoelectric body with decreasing distance to the side surface of the second metal layer.

6. The acoustic wave device according to claim 1, wherein the second metal layer includes a first barrier layer disposed on the first metal layer and a second barrier layer disposed on the first barrier layer.

7. The acoustic wave device according to claim 6, wherein
    the second barrier layer includes a side surface that connects a surface of the second barrier layer adjacent to the first barrier layer to a surface of the second barrier layer adjacent to the third metal layer; and
    at least a portion of an end portion of the side surface of the second barrier layer, the end portion being adjacent to the first barrier layer, is located closer to the third metal layer than a portion of the second barrier layer in contact with the first barrier layer.

8. The acoustic wave device according to claim 6, further comprising a metal oxide layer interposed between the first barrier layer and the second barrier layer.

9. The acoustic wave device according to claim 1, wherein
    the IDT electrode includes first and second busbars arranged opposite to each other, a plurality of first electrode fingers each connected at one end thereof to the first busbar, and a plurality of second electrode fingers interdigitated with the plurality of first electrode fingers and each connected at one end thereof to the second busbar;
    in the IDT electrode, a region where the first and second electrode fingers overlap as viewed in an elastic wave propagation direction is an overlap region;
    the overlap region includes a central area where an acoustic velocity of elastic waves is relatively high, and low-acoustic-velocity portions where the acoustic velocity is lower than in the central area, the low-acoustic-velocity portions being disposed at both ends of the central area in a direction in which the electrode fingers extend; and
    the third metal layer is disposed in the low-acoustic-velocity portions.

10. The acoustic wave device according to claim 1, further comprising a dielectric film disposed on a principal surface of the piezoelectric body to cover the IDT electrode.

11. An acoustic wave device comprising:
    a piezoelectric body; and
    an IDT electrode disposed on the piezoelectric body; wherein
    the IDT electrode includes a first metal layer disposed adjacent to the piezoelectric body, a second metal layer disposed on the first metal layer, and a third metal layer disposed on the second metal layer;

the second metal layer includes a side surface that connects a surface of the second metal layer adjacent to the first metal layer to a surface of the second metal layer adjacent to the third metal layer;

the third metal layer includes a side surface that connects a surface of the third metal layer adjacent to the second metal layer to a surface of the third metal layer opposite the second metal layer;

the side surface of the third metal layer includes a second end portion adjacent to the second metal layer;

the second end portion of the side surface of the third metal layer is directly connected to the side surface of the second metal layer;

the second metal layer includes an overhanging portion projecting outward from an outer edge of the first metal layer; and the overhanging portion extends in a direction away from the piezoelectric body, or extends parallel or substantially parallel to a direction in which a principal surface of the piezoelectric body extends.

12. The acoustic wave device according to claim 11, wherein the second metal layer includes a first barrier layer disposed on the first metal layer and a second barrier layer disposed on the first barrier layer.

13. The acoustic wave device according to claim 12, wherein the second barrier layer includes a side surface that connects a surface of the second barrier layer adjacent to the first barrier layer to a surface of the second barrier layer adjacent to the third metal layer; and at least a portion of an end portion of the side surface of the second barrier layer, the end portion being adjacent to the first barrier layer, is located closer to the third metal layer than a portion of the second barrier layer in contact with the first barrier layer.

14. The acoustic wave device according to claim 12, further comprising a metal oxide layer interposed between the first barrier layer and the second barrier layer.

15. The acoustic wave device according to claim 11, wherein the IDT electrode includes first and second busbars arranged opposite to each other, a plurality of first electrode fingers each connected at one end thereof to the first busbar, and a plurality of second electrode fingers interdigitated with the plurality of first electrode fingers and each connected at one end thereof to the second busbar;

in the IDT electrode, a region where the first and second electrode fingers overlap as viewed in an elastic wave propagation direction is an overlap region;

the overlap region includes a central area where an acoustic velocity of elastic waves is relatively high, and low-acoustic-velocity portions where the acoustic velocity is lower than in the central area, the low-acoustic-velocity portions being disposed at both ends of the central area in a direction in which the electrode fingers extend; and the third metal layer is disposed in the low-acoustic-velocity portions.

16. The acoustic wave device according to claim 11, further comprising a dielectric film disposed on a principal surface of the piezoelectric body to cover the IDT electrode.

17. The acoustic wave device according to claim 11, wherein the overhanging portion extends in a direction away from the piezoelectric body.

18. The acoustic wave device according to claim 11, wherein the overhanging portion extends parallel or substantially parallel to a direction in which a principal surface of the piezoelectric body extends.

19. The acoustic wave device according to claim 11, wherein the overhanging portion has a frame-shaped structure in plan view as seen from the third metal layer.

* * * * *